(12) United States Patent
Zhai et al.

(10) Patent No.: US 6,476,382 B1
(45) Date of Patent: Nov. 5, 2002

(54) SYSTEM AND METHOD FOR MEASURING THE SIZE OF A FOCUSED OPTICAL SPOT

(75) Inventors: Jinhui Zhai, Plano, TX (US); Tuviah E. Schlesinger, Mt. Lebanon, PA (US); Daniel D. Stancil, Mars, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 39 days.

(21) Appl. No.: 09/671,441

(22) Filed: Sep. 27, 2000

(51) Int. Cl.[7] .................................................. H01J 3/14
(52) U.S. Cl. ............................ 250/237 G; 250/559.19
(58) Field of Search ........................ 250/237 G, 237 R, 250/234, 216, 201.2, 559.19, 559.21, 559.24; 356/123, 627, 628; 369/44.23, 44.14

(56) References Cited

U.S. PATENT DOCUMENTS 4,358,200 A * 11/1982 Heemskerk et al. ........ 356/123

OTHER PUBLICATIONS

Loka et al., "A Novel Technique to Measure Laser Beam Spot Sizes", *Supplement to OPN Optics & Photonics News*, vol. 10, No. 5, May 1999.

* cited by examiner

Primary Examiner—Que T. Le
(74) Attorney, Agent, or Firm—Kirkpatrick & Lockhart LLP

(57) ABSTRACT

A system for measuring a size of a focused spot of an optical energy beam. The system includes a grating, a beam scanner oriented between a source of the optical energy beam and the grating, and a detector oriented to sense a diffraction pattern of the grating.

41 Claims, 8 Drawing Sheets

SYSTEM AND METHOD FOR MEASURING THE SIZE OF A FOCUSED OPTICAL SPOT

STATEMENT REGARDING FEDERALLY SPONSORED REASEARCH OR DEVELOPMENT

Certain of the research leading to the present invention was sponsored by the United States National Science Foundation under contract ECD-8907068. The United States Government may have certain rights in the invention.

CROSS-REFERENCE TO RELATED APPLICATIONS

Not Applicable.

BACKGROUND OF INVENTION

1. Field of Invention

The present invention relates generally to optics and, more particularly, to systems and methods for measuring the spot size of a focused optical spot in either a far-field or near-field system.

2. Description of the Background

In modern optical data storage systems, data are stored on an optical storage medium in the form of marks carried on a surface of the optical medium. The data may be accessed by focusing a laser beam onto the data surface of the optical medium and analyzing the light reflected by the marks. Storage density of the system is determined by the size of the beam (called the "spot") focused on the data surface. Consequently, the spot size affects the data storage density of the optical storage medium: the smaller the spot size, the greater the storage density. In addition to optical data storage. applications, reduction of spot size is beneficial for photolithography and microscopy applications as well. For example, in photolithography, smaller spot sizes allow for the exposure of finer features in photoresist.

In each of these applications, knowledge of the spot size is critical to designing an appropriate system. The size of a spot is typically determined by moving an obstruction, such as a ruling or a knife-edge, through the plane where the spot size is to be measured. To accurately measure the spot size using such a technique, the position of the knife-edge or the spacing between the opaque portions of the ruling must be precisely known. However, as spot sizes become smaller, such as on the order of nanometers, it becomes increasingly more difficult to accurately determine the spot size. This is, in part, because movement of the obstruction induces other types of mechanical motions which adversely affect the measuring system. In addition, the position of the knife-edge or the periodic spacing of the ruling must be even more accurately determined.

The problem of measuring focused spot sizes is even further complicated in near-field systems, where it is typically necessary to measure the spot size in a plane which is only a quarter-wavelength ($\lambda/4$) from a lens. This is because it is mechanically very difficult to move the obstruction in the measurement plane when it is so close to the lens.

Accordingly, there exists a need for a technique with which one can accurately measure increasingly smaller spot sizes. There further exists a need for such a technique to be accurate in near-field applications, such as a near-field optical head. There further exists a need for such a mechanism to have minimum susceptibility to mechanically-induced inaccuracies. There further exists a need for such a mechanism to be self-calibrating.

BRIEF SUMMARY OF INVENTION

The present invention is directed to a system for measuring a size of a focused spot of an optical energy beam. According to one embodiment, the system includes a grating, a beam scanner oriented between a source of the optical energy beam and the grating, and a detector oriented to sense a diffraction pattern of the grating.

According to another embodiment; the present invention is directed to a system for measuring a size of a focused spot of an optical energy beam, including a grating, means for scanning the focused spot relative to the grating over a scanning range that is greater than a groove width of the grating, and a split detector oriented to sense a diffraction pattern of the grating as the focused spot is scanned relative to the grating.

The present invention provides several advantages in comparison to existing techniques for measuring the size of a focused optical spot. Significantly, the technique of the present invention is self-calibrating and more precise than existing techniques. In addition, the present invention is less susceptible to errors introduced by noise and mechanical vibrations. Also, the present invention permits measurements of the focused spot sizes over a greater measurement range than existing techniques. Furthermore, the present invention may be used to measure the focused optical spot size for both near-field and far-field applications. These and other benefits of the present invention will be apparent from the detailed description hereinbelow.

DESCRIPTION OF THE FIGURES

For the present invention to be clearly understood and readily practiced, the present invention will be described in conjunction with the following figures, wherein.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, other elements found in a typical system for measuring the size of an optical spot. For example, specific operating system details and modules contained in the processor are not shown. Those of ordinary skill in the art will recognize that these and other elements may be desirable to produce a system incorporating the present invention. However, because such elements are well known in the art, and because they do not facilitate a better understanding of the present invention, a discussion of such elements is not provided herein.

Figure 1:
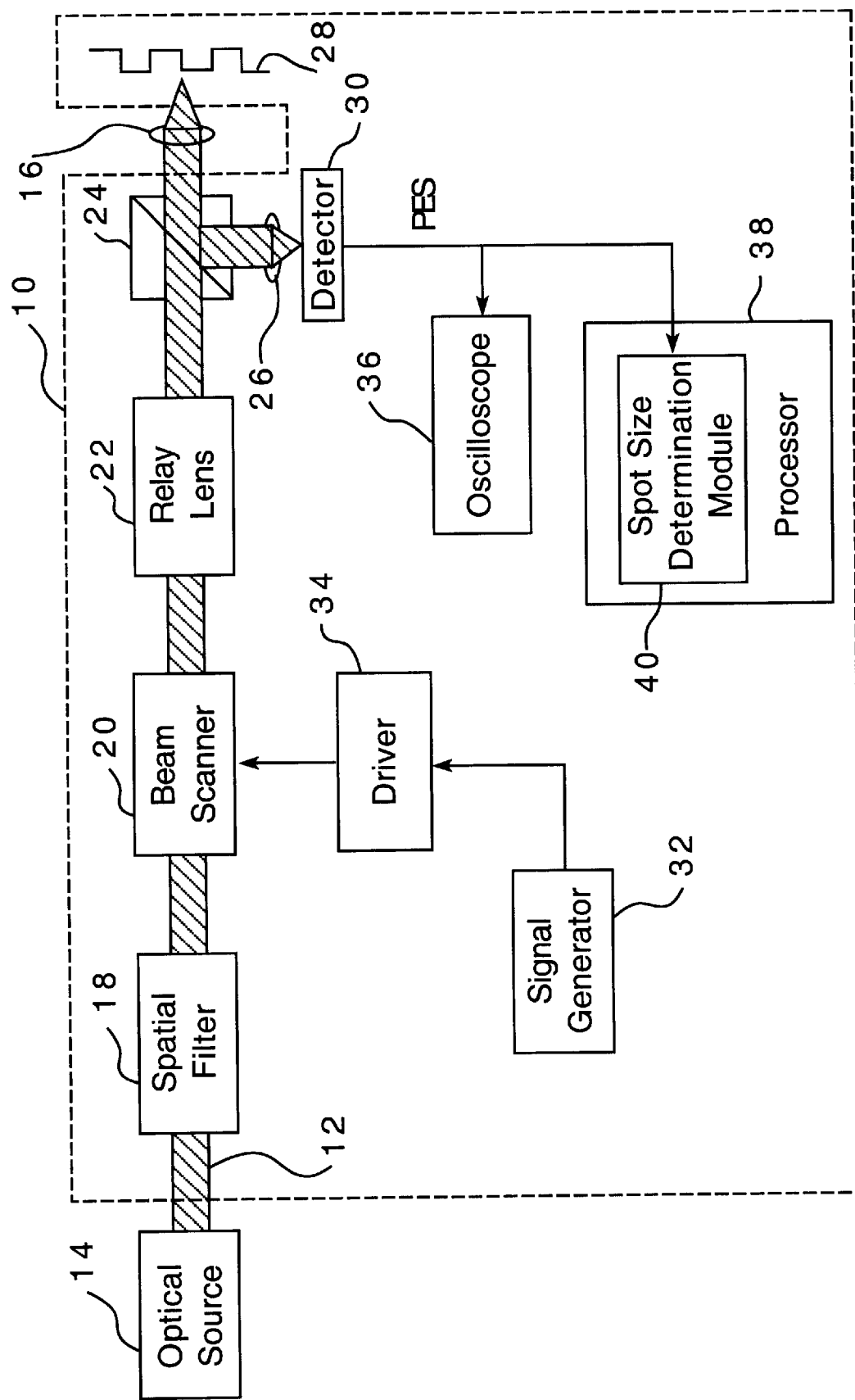
FIG. 1 is a block diagram of a system according to one embodiment of the present invention for measuring the size of a focused spot of an optical energy beam.

FIG. 1 is a block diagram of a system 10 according to one embodiment of the present invention for measuring the focused spot size of an optical energy beam 12 generated by an optical source 14 and focused by a lens 16. According to one embodiment, the system 10 may include a spatial filter 18, a beam scanner 20, a relay lens 22, a beamsplitter 24, a field lens 26, a periodic grating 28, and a detector 30. The system 10 may also include a signal generator 32 and a driver 34 in communication with the beam scanner 20 to operate the beam scanner 20, as discussed further hereinbelow. The system 10 may also include an oscilloscope 36 and a processor 38 in communication with the detector 30.

The optical source 14 may be any source of optical energy such as, for example, a laser producing collimated light. As such, the optical source 14 may be, for example, a Distributed Bragg Reflector (DBR) laser, a multi-frequency laser, a multiple of discrete laser sources, a laser array, or a GCSR laser. The lens 16 may be any type of lens used to focus optical energy impinging thereon such as, for example, an objective lens as used in conventional far-field applications. In addition, the lens 16 may be designed for near-field applications, such as a solid immersion lens (SIL) head (comprising an objective lens and a SIL) or an integrated solid immersion lens (ISIL), such as described in U.S. patent application Ser. No. 09/568,895, which is incorporated herein by reference.

As described further hereinbelow, the system 10 may measure the focused spot of the optical energy beam 12 based on the groove diffraction caused by scanning the beam 12 with the scanner 20 relative to the grating 28. The spot size may be obtained from a position error signal (PES) which indicates the position of the spot relative to a groove edge of the grating 28.

The spatial filter 18 may be any device used to deflect unwanted radiation from the optical energy beam 12 emitted by the optical source 14. According to one embodiment, the spatial filter 18 may be an emulsion mask having a translucent annular region in an otherwise opaque region.

The beam scanner 20 may be any device used to deflect the optical energy beam 12 relative to the grating 28 in, for example, one or two dimensions. According to one embodiment, the beam scanner 20 may an electro-optical (EO) beam scanner such as described in U.S. Pat. No. 5,317,446 or in U.S. patent application Ser. No. 09/216,472 filed Dec. 18, 1998, both of which are incorporated herein by reference. According to another embodiment, the beam scanner 20 may be, for example, a mechanical scanner. According to another embodiment of the present invention, the beam scanner 20 may be eliminated and other techniques for scanning the beam 12 relative to the grating may be used such as, for example, moving the grating 28 with, for example, a piezoelectric actuator.

For an embodiment in which the system 10 includes an EO beam scanner 20, small angle deflection of the optical energy beam 12 may be precisely controlled by a voltage signal applied to the EO beam scanner 20. This voltage signal may be generated by the signal generator 32 and applied to the EO beam scanner 16 via the driver 34. Accordingly, for an embodiment using an EO beam scanner 20, the optical energy beam 12 may be scanned without mechanical motion of the scanner 20. Thus, mechanical-movement induced errors in scanning the beam 12 may be reduced. Moreover, the beam 12 may be scanned at a sufficiently high frequency by applying a sufficiently high frequency signal with signal generator 32 to the EO beam scanner 20 such that mechanical resonant frequencies of other elements of the system 10 do not introduce intolerable noise into the system. The scanning frequency of the beam scanner 20 may be, for example, 1–2 kHz, although higher or lower scanning frequencies may be used, depending on the application.

The relay lens 22 may be used to image the deflection pivot plane of the beam scanner 20 to the pupil of the lens 16. In addition, the relay lens 22 may image the deflection pivot plane of the beam scanner 20 to a plane of the detector 30. Consequently, the beam displacement on the lens 16 may be minimized to reduce beam aberration caused by the beam scanner 20 deflection. According to one embodiment, the relay lens 22 may be embodied as, for example, a beam expander.

The grating 28 is positioned in the plane in which it is desired to measure the focused spot, and may include periodic optically transmissive portions (also called "grooves") and non-transmissive portions (also called "lands") in one or two dimensions. According to one embodiment, the grating may be a Ronchi ruling. For better accuracy in determining the spot size, the dimensions of the spacings between the transmissive and non-transmissive portions are precisely known. Sufficiently precise dimensions may be obtained using modern photolithography techniques to define the periodic transmissive and non-transmissive portions.

The beamsplitter 24 may be any device capable of dividing a beam of optical energy into two or more separate beams, and may be oriented to divide the optical energy reflected from the grating 28 to the detector 30 through the field lens 26. The beamsplitter 24 may be embodied as, for example, two right-angle prisms cemented together at their hypotenuse faces. The cemented face of one prism may be coated, before cementing, with a metallic or dielectric layer having the desired reflecting properties, both in the percentage of reflection and the desired color.

The field lens 26 is oriented between the beamsplitter 24 and the detector 30 to focus the optical energy reflected by the grating 28 onto the detector 30. According to one embodiment, the pivot plane of the beam scanner 20 is also imaged onto the detector 30 using the field lens 26 as a relay lens, thus fixing the focused spot on the detector 30 even though the return beam from the grating 28 may strike the field lens 26 with various deflection angles. Accordingly, any offset in the PES produced by the detector 30, as discussed further hereinbelow, may be minimized.

The detector 30 may be any device capable of sensing incident radiation and producing a signal indicative thereof such as, for example, a photodetector. The detector 30 may sense a diffraction pattern of the optical energy beam 12 as the focused spot is scanned relative to the grating 28. According to one embodiment, the detector 30 may be a split detector, i.e., a photodetector having, for example, two different sensing portions on, for example, separate halves of the detector 30, each used to sense incident radiation. The PES produced by the split detector 30 may be determined by comparing whether each of the separate detectors of the split detector 30 sense constructive interference or destructive interference of the incident radiation. For example, if one of the detectors of the split detector 30 senses incident constructive interference radiation, that detector may output a signal having a maximum value (e.g., one). Conversely, if the detector senses incident destructive interference radiation, that detector may output a signal having a minimum value (e.g., zero). The PES may be determined by subtracting the output signal of one of the detectors of the split detector 30 from the other of the detectors of the split detector 30. Consequently, if each of the detectors of the split detector 30 senses symmetrical interference radiation from the focused spot of the beam 12 as it is scanned relative to the grating 28, or if each of the detectors senses symmetrical non-diffraction patterns, the PES has a value of zero. On the other hand, if the split detectors sense asymmetrical interference radiation from the focused spot, the PES will have a value of one or negative one, depending on which of the detectors senses more radiation than the other.

The PES may be input to both the oscilloscope 36 and the processor 38. A signal amplifier (not shown) may be used if necessary to amplify the PES. The oscilloscope 36 may be used to provide a plot of the PES versus time as the beam 12 is scanned relative to the grating 12. The processor 38 may be used to determine the spot size from the PES as described further hereinbelow.

Figure 2:
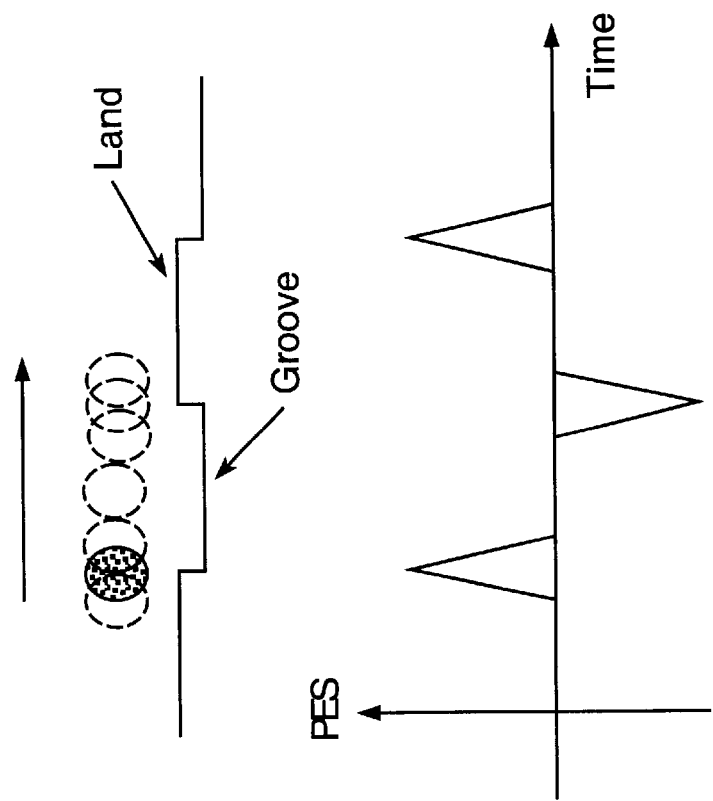
FIG. 2 is a graph of the position error signal (PES) generated with the system of FIG. 1 when the focused spot is scanned across the grating according to one embodiment of the present invention.

Using this approach to measure the size of the focused spot, the beam 12, reflected from the optically non-transmissive portions of the grating 28 or transmitted through the optically transmissive portions, produces an asymmetric distribution that contains the spot position information. As the beam 12 is scanned relative to the grating 28, the PES is maximum if the center of the spot is above a groove edge of the grating and is zero if the center of the spot is above the center of a groove or a land of the grating 28. The PES may also have a value of zero when the edge of the scanning spot has passed the groove edge if the groove width is larger than the spot size, as illustrated in FIG. 2. In this case, the spot is completely on the land or the groove, thus no diffraction occurs from the grooved media and the return spot on the split detector 30 is symmetric. For an embodiment in which the spot scans the groove with a constant linear speed, the spot size may be determined based on the amount of time it takes for the spot to scan the entire groove width and the time it takes the spot to pass the groove edge. As discussed hereinbefore, better accuracy in determining the spot size may be realized when the groove width is precisely known. Moreover, the groove width may be used as a calibration, thus providing a self-calibrating system.

Figure 3:
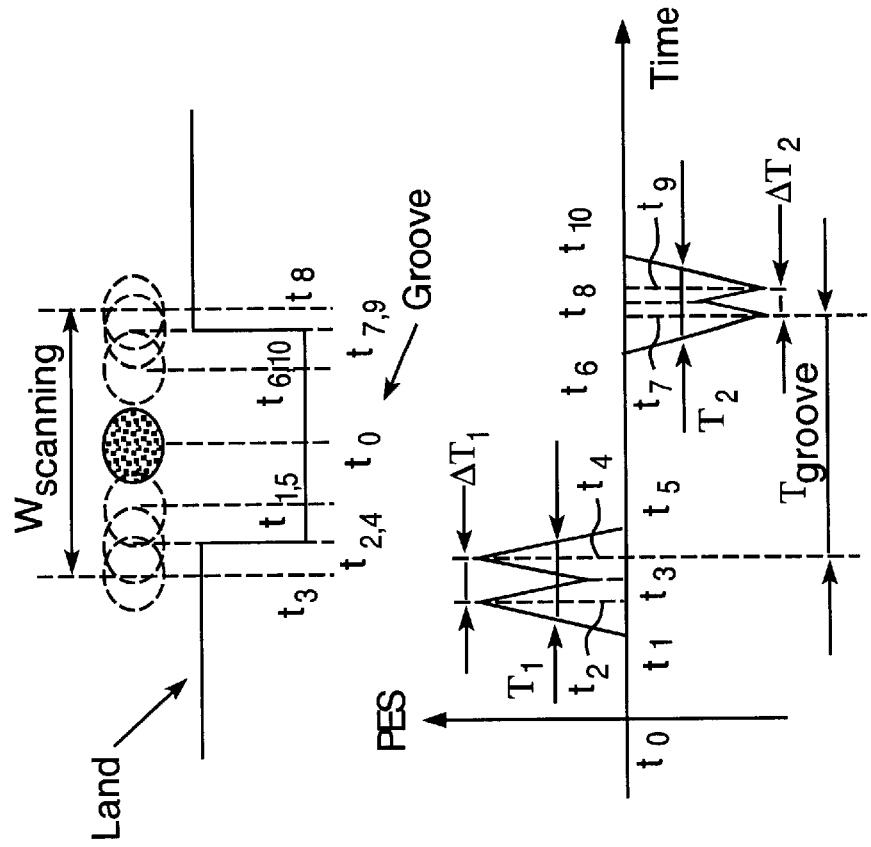
FIG. 3 is a graph of the PES versus time for an embodiment where the scanning range is greater than the groove width.

According to one embodiment, the relative motion range of the focused spot (induced, for example, by the beam scanner 20) is greater than the groove width ($W_{groove}$) in order that the spot may be scanned over both groove edges. FIG. 3 is a plot of the PES when the spot is scanned over the grating 28 with the range of $W_{scanning} \geq W_{groove}$. Note that the PES is not symmetric when the spot scans each groove edge. This is because the spot may not be in the center of the groove at the initial time of the scan.

The system 10 may calculate the spot size based on the PES using the processor 38. The processor 38 may be implemented as, for example, a computer, such as a workstation or a personal computer, a microprocessor, or an application specific integrated circuit (ASIC). The processor 38 may include a spot size determination module 40 for calculating the spot size from the PES. The spot size determination module 40 may be implemented as software code to be executed by the processor 38 using any type of computer instruction type suitable such as, for example, microcode, and can be stored in, for example, an electrically erasable programmable read only memory (EEPROM), or can be configured into the logic of the processor 38. According to another embodiment, the module 40 may be implemented as software code to be executed by the processor 38 using any suitable computer language such as, for example, C or C++ using, for example, conventional or object-oriented techniques. The software code may be stored as a series of instructions or commands on a computer readable medium, such as a random access memory (RAM), a read only memory (ROM), a magnetic medium such as a hard-drive or a floppy disk, or an optical medium such as a CD-ROM.

The spot size determination module 40 may calculate the spot size based on the PES from the following equation:

$$d_{spot} = \frac{(T_1 - \Delta T_1) + (T_2 - \Delta T_2)}{2 \cdot T_{groove}} \cdot W_{groove} \qquad (1)$$

where $d_{spot}$ is full width half maximum (FWHM) diameter of the spot. If $W_{scanning} = W_{groove}$ and the spot is at the center of the groove at the initial time of the scan, then $\Delta T_1 = 0$, $\Delta T_2 = 0$ and $$d_{spot} = W_{groove} \frac{(T_1 + T_2)}{2 \cdot T_{groove}} \qquad (2)$$

Figure 4:
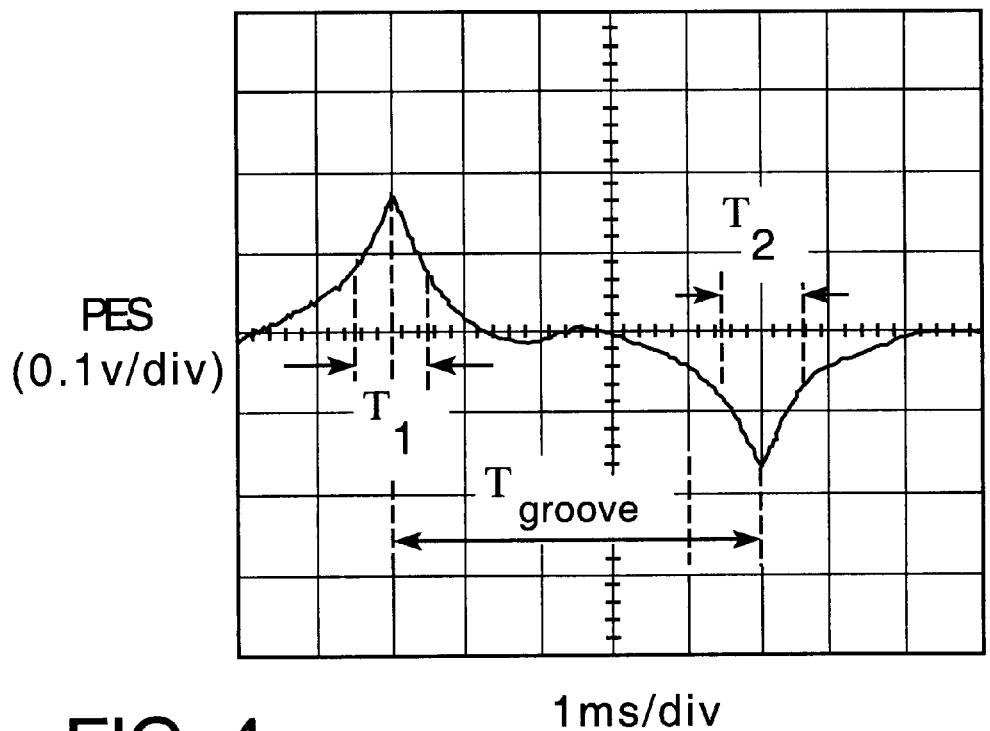
FIG. 4 is a graph of the PES versus time for a focused spot generated by a conventional optical head where the groove width is 4.5 $\mu$m.
Figure 5:
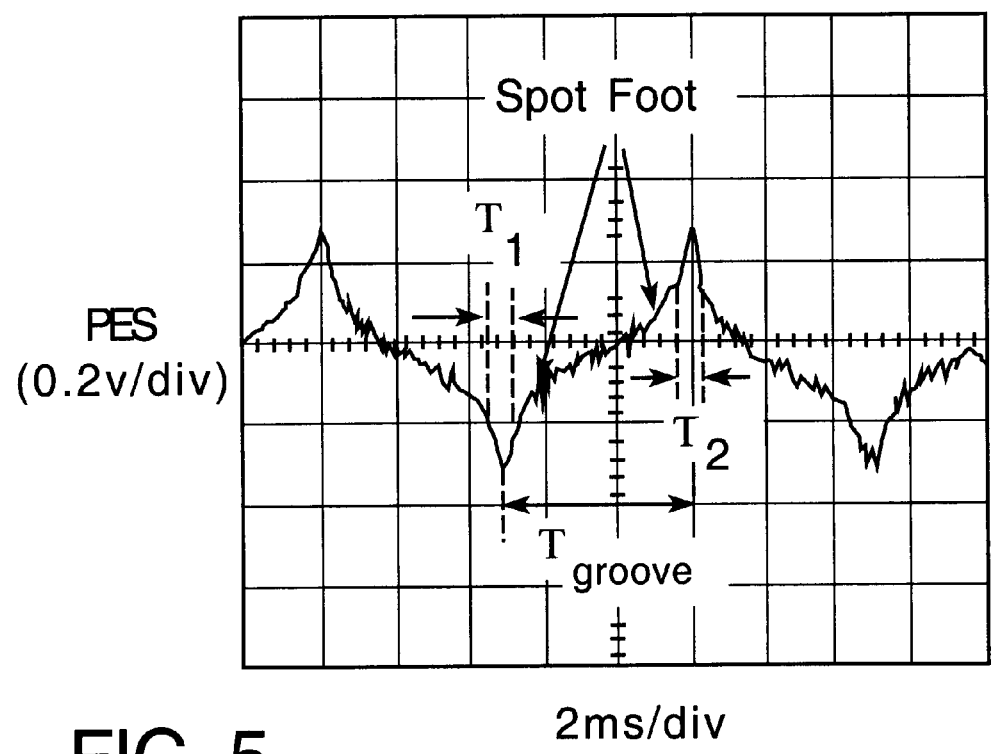
FIG. 5 is a graph of the PES versus time for a focused spot generated by a solid immersion lens (SIL) head where the groove width is 2.0 $\mu$m.

Experimental results have been obtained using the system 10 to measure the spot size of a conventional optical head. Using a grating 28 with a groove width of 4.5 μm, FIG. 4 is a plot of the PES versus time when the spot is scanned over a range equal to the groove width and the spot is at the center of groove at the initial time. From the graph, the following values may be calculated: $T_1 = 1.0$ ms, $T_2 = 1.1$ ms, and $T_{groove} = 5.0$ ms. Thus, from equation (2), the spot size (FWHM) is calculated to be 0.945 μm. In comparison, using a SpotScan® Model 0390 optical profiler from Photon Inc., San Jose, Calif., the spot size was determined to be 0.942 μm, or within about 0.3%.

Where the system is used to measure a near-field focused spot generated by, for example, a SIL head as the lens 16, the deflection pivot plane of the beam scanner 20 may be imaged onto the pupil of the SIL lens. This is because the spot aberration from a SIL head is much more sensitive to the beam displacement on the SIL lens. Using a grating 28 with a groove width of 2.0 μm, FIG. 5 is a plot of experimental measurements of the PES versus time for a near-field spot for a wavelength (λ) of 488 nm where the effective numeral aperture (NA) of the objective lens of the SIL head is 0.5 and the SIL is a supershere SIL with a refractive index of n=1.8. Based on the PES plot, $T_1 = 0.48$ ms, $T_2 = 0.44$ ms, and $T_{groove} = 5.0$ ms. Thus, using equation (2) again, the focused spot size (FWHM) from the SIL head 16 is 182 nm. Theoretically, the spot size is $d_{SIL} = \lambda/(2 \cdot n^2 \cdot NA) = 150$ nm. Thus, the measured result from the scanning groove technique of the present invention is very close to the minimum focused spot size. The measured result is reasonable considering the manufacturing error of the SIL, the alignment error of the SIL head 16, and the beam aberration caused by the other optical elements before the objective lens of the SIL head 16.

The present invention provides many advantages in comparison to other techniques for measuring the focused spot size of an optical energy beam. One advantage is that the system is self-calibrating, even if the voltage signal applied to the beam scanner 20 to deflect the beam 12 cannot be precisely known. This is because the time period between occlusion and non-occlusion generated by scanning the focused spot across the grating 28 corresponds to precisely known dimensions for the transmissive and non-transmissive portions of the grating 28. Another advantage is that the physical optics principles make the approach of the present invention more precise in measuring the spot size because there are no measurement errors caused by diffraction from the groove edge or the non-transmissive portion of the grating 28 as in existing techniques. In addition, there is no noise due to the backreflected light from the grating 28.

Another advantage of the present invention is that it provides a greater measurement range than existing techniques. The focused spots that can be measured with the approach of the present invention span a large range, such as from several nanometers to several hundred microns. In addition, the approach of the present invention permits the measurement of nanometer range spot sizes because the measurable spot size depends only on the groove width and the calibrating groove width can be much larger than the measured spot size.

A further advantage of the present invention is that, for an embodiment in which the beam scanner 20 moves the spot relative to the grating 28 (rather than mechanically moving the grating 28 with, for example, a piezo actuator) it is possible to position the grating 28 very close to the lens 16, such as on the order of $\lambda/4$. This is especially beneficial in near-field applications where the lens 16 is, for example, a SIL head or an ISIL.

Figure 6:
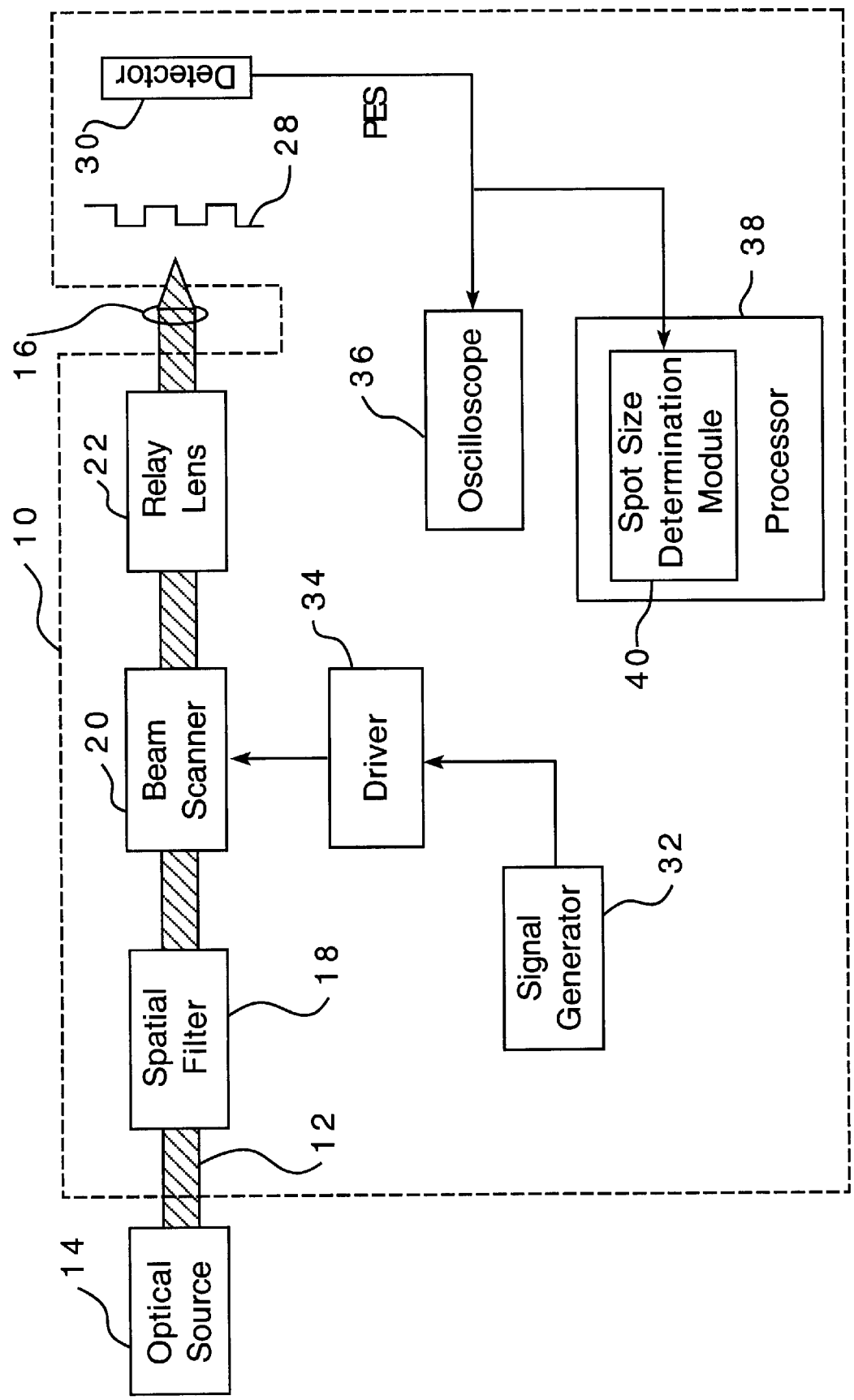
FIG. 6 is a diagram of the system according to another embodiment of the present invention.

FIG. 6 is a diagram of the system 10 according to another embodiment of the present invention. The system 10 of FIG. 6 is similar to that of FIG. 1, except that the detector 30 is positioned on the opposite side of the grating 28 relative to the optical source 14. According to such an embodiment, the beamsplitter 24 and field lens 26 may be eliminated.

Figure 7:
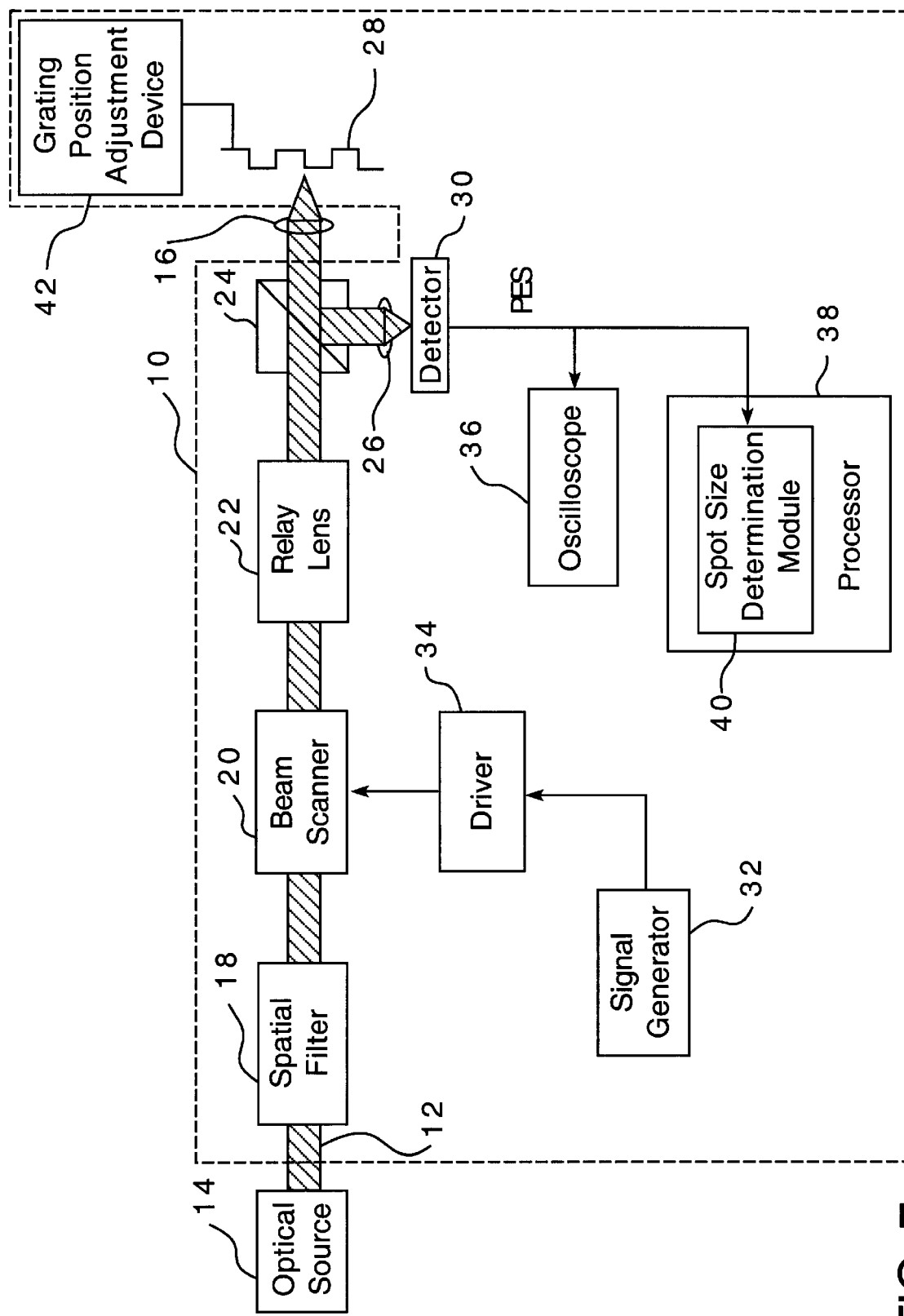
FIG. 7 is a diagram of the system according to another embodiment of the present invention.

FIG. 7 is a diagram of the system 10 according to another embodiment of the present invention. The system 10 of FIG. 7 is similar to that of FIG. 1, except that it additionally includes a grating position adjustment device 42 in communication with the grating 28. The grating position adjustment device 42 may be used to adjust the position and orientation of the grating 28 such that it is in the plane in which it is desired to measure the focused spot. For example, based on the plot of the PES versus time, which is observable in real time on the oscilloscope 36, the grating position adjustment device 42 may be used to move the grating 28 translationally and/or rotationally relative to the lens 16 and the scanning direction of the beam 12 to locate a more accurate focal plane and thereby yield a more accurate calculation of the focused spot size. This system may measure the spot size near the focal plane (such as, e.g., within $0.5\lambda$ to $1.0\lambda$), which may be very useful for analyzing the intensity distribution along the axis for experimental optical field analyses of a near-field SIL head. According to one embodiment, the grating position adjustment device 42 may be any electrical control stage such as, for example, a piezoelectric actuator.

Figure 8:
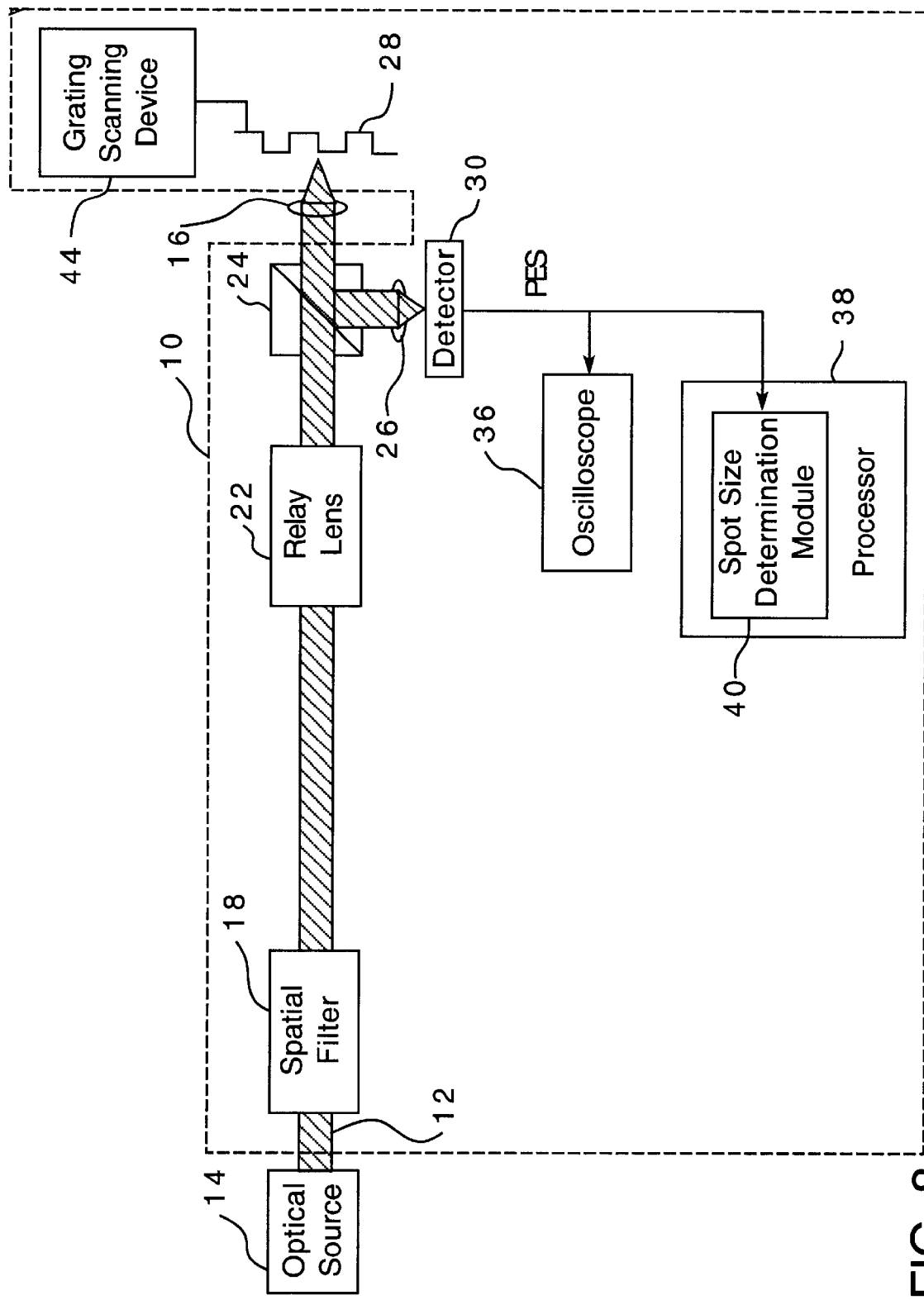
FIG. 8 is a diagram of the system according to another embodiment of the present invention.

FIG. 8 is a diagram of the system 10 according to another embodiment of the present invention. The system 10 illustrated in FIG. 8 is similar to that of FIG. 1, except that it includes a grating scanning device 44 in communication with the grating 28. According to such an embodiment, the grating scanning device 44 may scan the grating 28 relative to a fixed spot. As such, the components of the system of FIG. 1 for moving the spot relative to the grating 28, e.g., the signal generator 32, the driver 34, and the beam scanner 20, may be eliminated from the system 10 of FIG. 8. According to one embodiment, the grating scanning device 44 may be, for example, a piezoelectric actuator or a rotating drum.

As discussed hereinbefore, the grating 28 may include periodically spaced optically transmissive and non-transmissive portions in one or two dimensions. To measure the focused spot size in one dimension, a one-dimensional grating 28 may be utilized and the beam scanner 20 may scan the beam 12 orthogonally relative to the orientation of the grooves of the grating 28. To measure the focused spot size in two dimensions, a two-dimensional grating may be utilized and the beam scanner 20 may scan the beam 12 in two dimensions.

Figure 9:
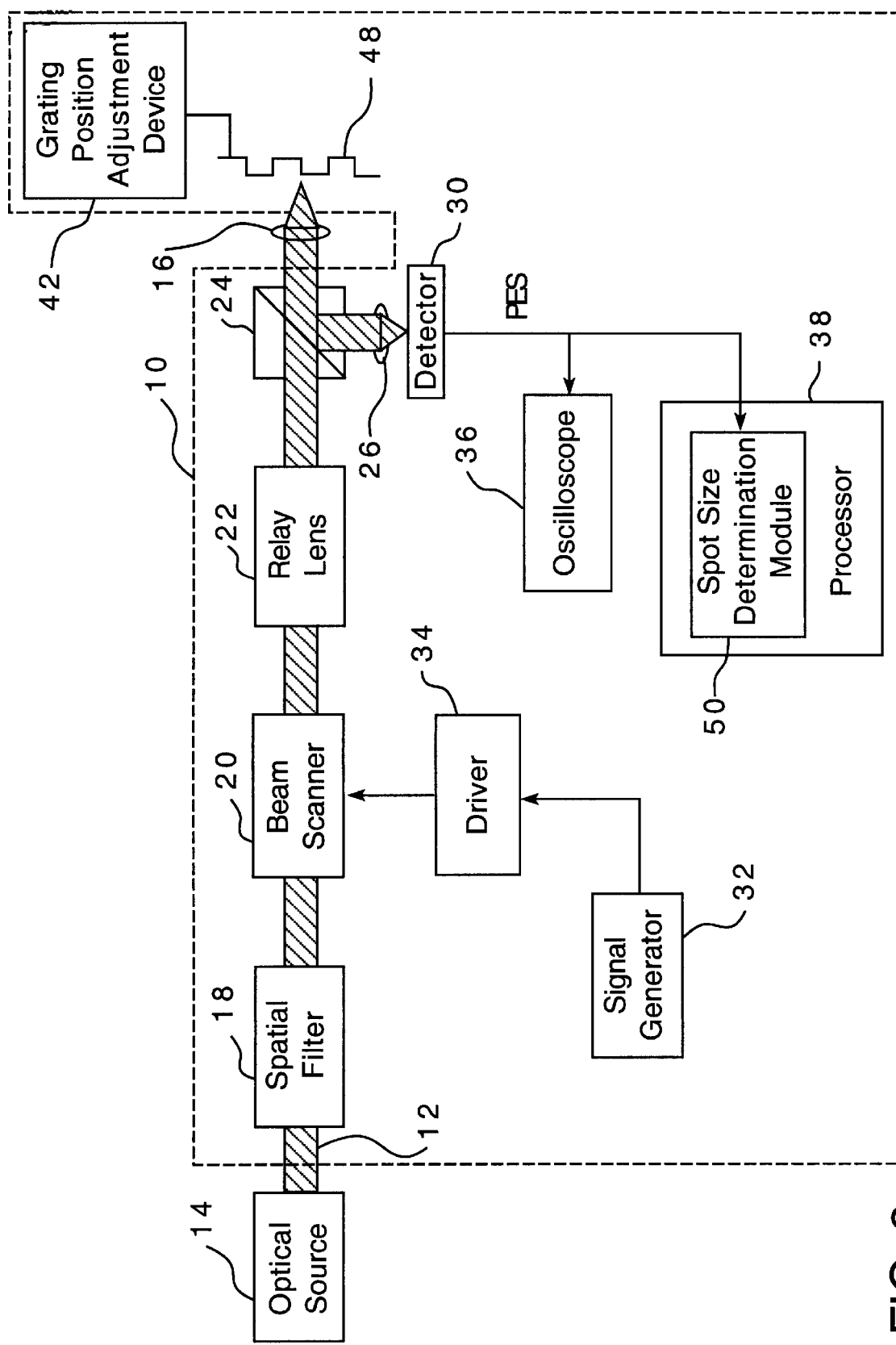
FIG. 9 is a diagram of the system according to another embodiment of the present invention.
Figure 10:
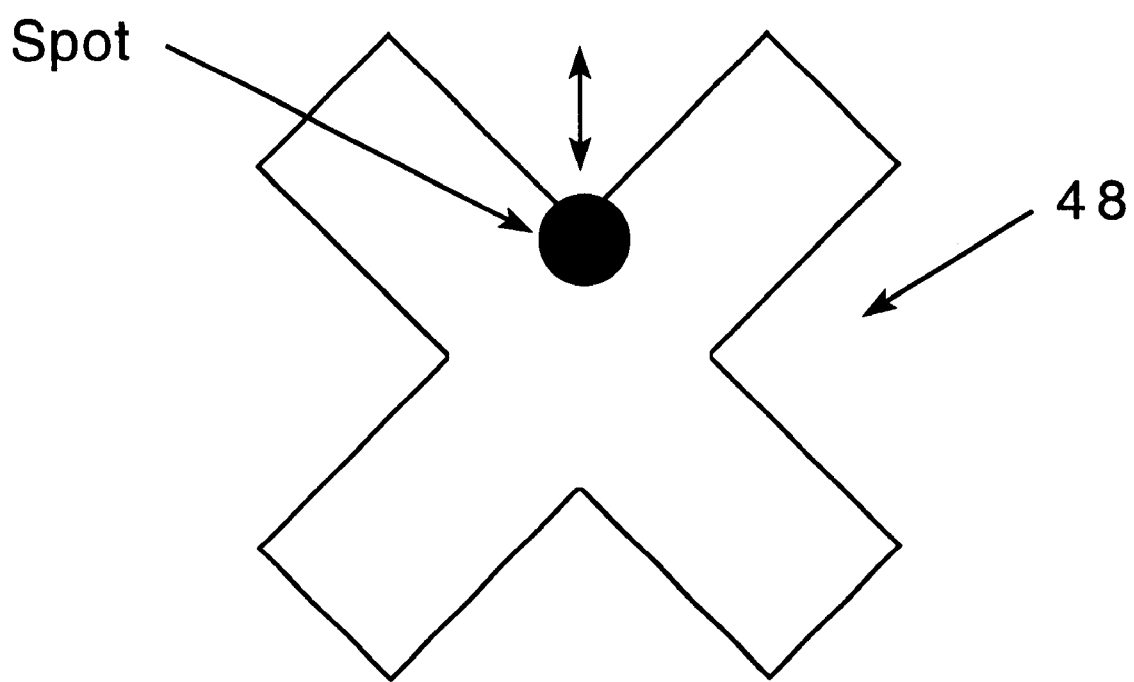
FIG. 10 is a diagram of a two-dimensional grating for two-dimensional spot-size measurement according to one embodiment of the present invention.

Two-dimensional spot size measurement may also be realized with a one-dimensional scanning deflector when a two-dimensional grating is oriented at an angle relative to the spot scanning direction. FIG. 9 is a diagram of the system 10 according to such an embodiment. The system of FIG. 9 is similar to that of FIG. 7, except that the one-dimensional grating 28 is replaced with a two-dimensional grating 48. FIG. 10 is a diagram of a two-dimensional grating 48 according to one embodiment of the present invention. In addition, the spot size determination module 40 may be replaced by a two-dimensional spot size determination and optical profiler module 50. The detector 30 may be a two-dimensional split detector. According to one embodiment, the detector 30 may be a quad-detector used as a two-dimensional split scanner. The grating position adjustment device 42 may be used to adjust the orientation of the two-dimensional grating 48 such that it is at an angle relative to the spot scanning direction. The two-dimensional spot size determination and optical profiler module 50 may calculate the two-dimensional spot size from the PES and yield the optical spot profile from the two-dimensional spot size information. In addition, a spot size distribution may be calculated by moving the grating 48 over a range of positions near the focal plane of the lens 16. According to one embodiment, the grating position adjustment device 42 may be a rotation stage and the two-dimensional grating 48 may be adjusted to, for example, forty-five degrees relative to the spot scanning direction. For an embodiment in which the grating position adjustment device 42 includes a rotation stage, the rotation stage may be very accurate, having a resolution of, for example, 10 arc sec or better.

According to one an embodiment, the beam scanner 20 may scan the beam 12 at a very high speed such as, for example, greater than 1 kHz. According to one embodiment, the scanning frequency may be 2 kHz. As a result, one may obtain different focused spot sizes and profiles in real time when adjusting the measured optical system due to the very high scanning speed. This may be used, for example, for real-time evaluation and adjustment for near-field SIL heads. For example, according to such an embodiment, the tilt and axis of the objective lens and the SIL may be adjusted based on the spot size distribution. In addition, the distance between the SIL and the objective lens of the near-field SIL head may be adjusted to realize a minimum spot size in the focal plane of the near-field SIL head. According to such an embodiment, the grating 28 may be positioned in the focal plane of the near-field SIL head.

As discussed hereinbefore, the detector 30 may be a split detector having two separate incident radiation sensing portions. According to another embodiment, the detector 30 may include a single incident radiation sensing portion. According to such an embodiment, the output signal of the detector 30 would correspond approximately to the reflected or transmitted beam intensity signal as the focused spot is scanned across the grating 28. The spot size determination module 40 may calculate the spot size according to such an embodiment based on the measured signal and precise information as to the deflection of the beam 12 introduced by the beam scanner 20. In this case, the grating 28 acts like a knife-edge or a ruling.

Although the present invention has been described herein with respect to certain embodiments, those of ordinary skill in the art will recognize that many modifications and variations of the present invention may be implemented. The foregoing description and the following claims are intended to cover all such modifications and variations.

What is claimed is:

1. A system for measuring a size of a focused spot of an optical energy beam, comprising:
    a grating;
    a beam scanner oriented between a source of the optical energy beam and the grating; and
    a detector oriented to sense a diffraction pattern of the grating.

2. The system of claim 1, wherein the detector includes a split detector.

3. The system of claim 1, further comprising a processor in communication with the detector for computing the size of the focused spot based on a beam intensity signal from the detector.

4. The system of claim 1, wherein the beam scanner includes an electro-optical beam scanner.

5. The system of claim 4, further comprising a relay lens for imaging a deflection pivot plane of the beam scanner to a pupil of a lens producing the focused spot.

6. The system of claim 5, wherein the relay lens is further for imaging a deflection pivot plane of the beam scanner to a plane of the detector.

7. The system of claim 1, further comprising a spot size determination module in communication with the detector.

8. The system of claim 1, further comprising a grating position adjustment device in communication with grating.

9. The system of claim 1, further comprising an oscilloscope in communication with the detector.

10. The system of claim 1, further comprising a beam splitter oriented to reflect optical energy reflected by the grating onto the detector.

11. The system of claim 1, wherein the grating is selected from the group consisting of a one-dimensional grating and a two-dimensional grating.

12. A system for measuring a size of a focused spot of an optical energy beam, comprising:
    a grating;
    means for scanning the focused spot relative to the grating over a scanning range that is greater than a groove width of the grating; and
    a split detector oriented to sense a diffraction pattern of the grating as the focused spot is scanned relative to the grating.

13. The system of claim 12, wherein the grating is selected from the group consisting of a one-dimensional grating and a two-dimensional grating.

14. The system of claim 12, further comprising a processor in communication with the split detector for computing the size of the focused spot based on a position error signal from the split detector.

15. The system of claim 12, wherein the means for scanning includes a beam scanner oriented between a source of the optical energy beam and the grating.

16. The system of claim 12, wherein the means for scanning includes a piezo actuator in communication with the grating for moving the grating relative to the optical energy beam.

17. The system of claim 12, further comprising a beam splitter oriented to reflect optical energy reflected by the grating onto the split detector.

18. The system of claim 12, wherein:
    the grating includes periodically spaced optically transmissive portions and optically non-transmissive portions oriented in one dimension; and
    the means for scanning includes means for scanning the focused spot relative to the grating in a dimension orthogonal to the dimension of the periodically spaced portions of the grating.

19. The system of claim 12, wherein:
    the grating includes periodically spaced optically transmissive portions and optically non-transmissive portions oriented in two dimensions; and
    the means for scanning includes means for scanning the focused spot relative to the grating in two dimensions relative to the grating.

20. The system of claim 12, wherein the grating is positioned in a near-field region of a lens producing the focused spot.

21. The system of claim 12, wherein the grating is positioned in a focal plane of a near-field lens producing the focused spot.

22. A method for measuring a size of a focused spot of an optical energy beam, comprising:
    scanning the focused spot across a grating over a scanning range that is greater than a groove width of the grating;
    simultaneously sensing interference patterns at first and second positions as the focused spot is scanned across the grating; and
    determining the size of the focused spot based on the interference patterns at each of the first and second positions.

23. The method of claim 22, wherein scanning the focused spot across a grating includes deflecting the optical energy beam relative to the grating.

24. The method of claim 22, wherein scanning the focused spot across a grating includes moving the grating relative to the optical energy beam.

25. A method of determining a profile of a focused spot of an optical energy beam, comprising:
    scanning the focused spot in a scanning direction relative to a two-dimensional grating, wherein the two-dimensional grating is oriented at an angle with respect to the scanning direction;
    sensing a two-dimensional diffraction pattern of the grating; and
    determining the profile of the focused spot based on the two-dimensional diffraction pattern.

26. A method for measuring a spot size distribution of a focused spot of an optical energy beam near a focal plane of a lens, comprising:
    scanning the optical energy beam across a grating over a scanning range that is greater than a groove width of the grating;
    moving the grating over a range of positions near the focal plane of the lens;
    sensing diffraction patterns of the grating over the range of positions; and
    determining the spot size distribution of the focused spot near the focal plane based on the diffraction patterns.

27. The method of claim 26, wherein scanning the optical energy beam includes deflecting the optical energy beam with an electro-optical beam scanner positioned between a source of the optical energy beam and the grating.

28. The method of claim 26, wherein moving the grating includes moving the grating in an axial direction.

29. The method of claim 28, wherein moving the grating includes moving the grating in an axial direction with a piezoelectric actuator in communication with the grating.

30. A system for measuring a two-dimensional spot size of a focused spot of an optical energy beam, comprising:
 a two-dimensional grating;
 a beam scanner for scanning the focused spot in a scanning direction relative to the grating over a scanning range greater than a groove width of the grating;
 means for adjusting an orientation of the two-dimensional grating relative to the scanning direction; and
 a two-dimensional split detector oriented to sense a diffraction pattern of the optical energy beam as the focused spot is scanned relative to the grating.

31. The system of claim 30, wherein the means for adjusting includes a rotation stage.

32. The system of claim 30, wherein the system is for measuring the two-dimensional spot size of a near-field head.

33. The method of claim 25, wherein scanning includes moving the grating relative to the optical energy beam.

34. The method of claim 25, further comprising adjusting an orientation of the two-dimensional grating relative to the scanning direction.

35. The method of claim 34, wherein the focused spot is produced by a near-field head, and further comprising adjusting a condition of the near-field head based on the profile of the focused spot.

36. The method of claim 35, wherein adjusting a condition of the near-field head includes adjusting a condition of the near-field head based on the profile of the focused spot when the grating is positioned in a focal plane of the near-field head.

37. The method of claim 36, wherein adjusting a condition of the near-field head includes adjusting a condition of the near-field head such that the profile of the focused spot is minimized in the focal plane of the near-field head.

38. The method of claim 25, wherein scanning includes scanning the focused spot relative to the two-dimensional grating, wherein the grating is oriented at a forty-five degree angle with respect to the scanning direction.

39. The method of claim 25, wherein sensing include sensing the two-dimensional diffraction pattern of the grating with a two-dimensional split detector.

40. The method of claim 39, wherein determining the profile of the focused spot includes determining the profile of the focused spot with a processor in communication with the two-dimensional split detector.

41. The method of claim 25, wherein scanning includes deflecting the optical energy beam relative to the grating.

* * * * *